(12) United States Patent
Hebert et al.

(10) Patent No.: US 7,411,438 B2
(45) Date of Patent: Aug. 12, 2008

(54) LOW-POWER INTEGRATED-CIRCUIT SIGNAL PROCESSOR WITH WIDE DYNAMIC RANGE

(75) Inventors: Gary Hebert, Shrewsbury, MA (US); Frank Thomas, Lunenburg, MA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 10/963,275

(22) Filed: Oct. 12, 2004

(65) Prior Publication Data

US 2005/0099229 A1    May 12, 2005

Related U.S. Application Data

(60) Provisional application No. 60/510,491, filed on Oct. 10, 2003.

(51) Int. Cl.
*H03L 5/00* (2006.01)

(52) U.S. Cl. .............................. 327/333; 326/80; 326/81
(58) Field of Classification Search ................. 327/333; 326/80, 81
See application file for complete search history.

(56) References Cited

U.S. PATENT DOCUMENTS

| | | | | | |
|---|---|---|---|---|---|
| 3,967,207 | A | * | 6/1976 | Wheatley, Jr. | ............... 330/309 |
| 4,176,286 | A | * | 11/1979 | Shuffield, Jr. | ................ 327/69 |
| 6,031,392 | A | * | 2/2000 | Yee | .............................. 326/80 |

* cited by examiner

*Primary Examiner*—Kenneth B. Wells
(74) *Attorney, Agent, or Firm*—McDermott Will & Emery LLP

(57) ABSTRACT

An integrated circuit includes at least three separate power supply terminals, at least one for those portions of the circuit that must accommodate the widest signal-related voltage excursion, at least one for those that experience substantially smaller signal-related voltage excursions, and a common terminal.

7 Claims, 5 Drawing Sheets

LOW-POWER INTEGRATED-CIRCUIT SIGNAL PROCESSOR WITH WIDE DYNAMIC RANGE

RELATED APPLICATION

This application is related to provisional application Ser. No. 60/510,491 filed Oct. 10, 2003.

FIELD OF THE DISCLOSURE

This disclosure relates to analog and mixed-signal integrated circuits (ICs) that require wide dynamic range while minimizing power consumption and power-supply complexity. More specifically, it relates to analog and mixed-signal ICs that require wide dynamic range while operating from low power-supply voltages, such as those typically encountered in battery-powered devices.

BACKGROUND OF THE DISCLOSURE

The dynamic range of analog information signal-processing circuits is inherently constrained by circuit noise, which obscures the smallest information signals, and power supply limitations, which limit the largest information signals that can be processed accurately. Many applications, especially portable, battery-powered audio products, require wide dynamic range and simultaneously low-power operation from low-voltage power supplies.

A particular class of applications involves conditioning the output voltage from a transducer or sensor. It is often advantageous to amplify the output voltage from such a source prior to further signal processing. It is also often advantageous to terminate such a source with a specific load impedance to maximize its signal-to-noise ratio and/or tailor its frequency response. These functions are typically accomplished by a preamplifier. In systems operating from low power-supply voltages, it is often desirable for the circuit to perform further signal processing on currents representative of the preamplifier output, rather than voltages. As is well known in the art, many current-mode, signal-processing circuits have been developed that minimize signal-related voltage excursions in the circuit. Such circuits, if designed to operate in class AB, also consume little power supply current under quiescent conditions. This makes them particularly desirable for battery-powered applications.

When such a signal-processing system is implemented in integrated circuit form, all sections of the circuitry typically operate from a single pair of power supply terminals. In this case, the power supply voltage of the entire IC must be set to accommodate the maximum preamplifier output voltage necessary to achieve the desired dynamic range. In systems with wide dynamic range requirements, this results in other parts of the circuitry, such as current-mode signal processing circuits, operating at a higher-than-necessary power-supply voltage.

SUMMARY OF THE DISCLOSURE

In accordance with the present approach, at least three separate power supply terminals are provided on an integrated circuit, at least one coupled solely to those portions of the circuit that must accommodate the widest signal-related voltage excursion and at least one coupled solely to those that experience substantially smaller signal-related voltage excursions.

DETAILED DESCRIPTION

Figure 1:
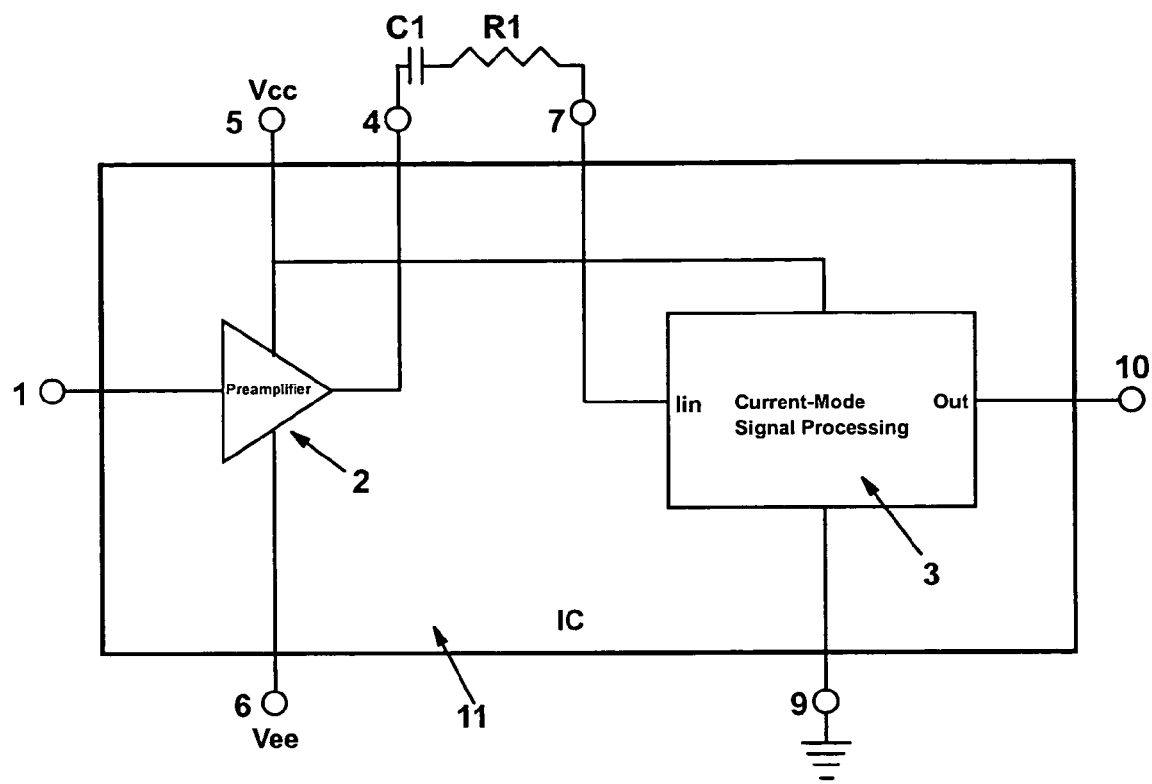
FIG. 1 is a block diagram of a preferred embodiment of an analog integrated circuit with a common positive power supply terminal, a ground terminal, which serves as the negative power supply terminal for a current-mode signal-processing section, and a separate negative power supply terminal for an input-voltage preamplifier.

FIG. 1 shows a block diagram an integrated circuit, 11, with a common positive power-supply terminal for an input voltage preamplifier and a current-mode signal-processing section and separate negative power-supply terminals for the input-voltage preamplifier circuitry and current-mode signal-processing section. In this embodiment, preamplifier 2 receives a positive power-supply voltage Vcc via terminal 5 and a negative power supply voltage Vee via terminal 6. Preamplifier 2 accepts an input voltage from terminal 1. Its output voltage, at terminal 4, will be capable of positive excursions up to close to the positive supply voltage Vcc and negative excursions up to close to the negative supply voltage Vee. If Vcc and Vee are equal in magnitude, the available dynamic range at preamplifier 2's output is increased by about 6 dB over the dynamic range available when the preamplifier 2 is operated using only the power supply voltage Vcc. The output voltage from preamplifier 2 is coupled to the input of current-mode signal processing block 3 via current-to-voltage conversion resistor R1 and ac-coupling capacitor C1. Signal-processing block 3 also receives the positive power-supply voltage Vcc via terminal 5. Its negative power supply terminal is connected to the reference potential, or ground, via terminal 9. As is typical of such current-mode circuits, signal-processing block 3 is designed to have a low-impedance input (virtual ground) accepting input currents. In this embodiment, input terminal 7 of the current-mode signal processing block 3 preferably has a dc bias potential between Vcc and Ground. Preamplifier 2 preferably is designed to have a dc bias potential half way between Vcc and Vee in order to maximize the possible voltage swing at its output. Ac coupling capacitor C1 blocks dc currents that would result from the differing dc bias potentials at terminals 4 and 7. Such currents would increase the supply current of the IC and potentially reduce the dynamic range of current-mode signal-processing block 3, particularly if signal-processing block 3 is a class AB circuit. Note that it is assumed that output 10 is a current or otherwise does not require large voltage excursions. If a large voltage swing were required at this output, a current-to-voltage converter that operated from Vcc and Vee could be added to produce an output voltage from the current-mode signal-processing block's output.

The embodiment in FIG. 1 is well suited to applications that utilize other integrated circuits that operate from a single positive power supply, such as most digital logic circuits. In this case, the positive power supply voltage, Vcc, would be shared by all of the ICs. The negative power-supply voltage for the preamplifier, Vee, can be generated from the positive power supply Vcc, for example, by a switched-capacitor voltage inverter. Since such an inverter must supply only the supply current for preamplifier 2, the required capacitors for the inverter can be relatively small. With an appropriate semiconductor process, such an inverter may be integrated into the integrated circuit 11, resulting in very low power-supply complexity for the application.

Figure 2:
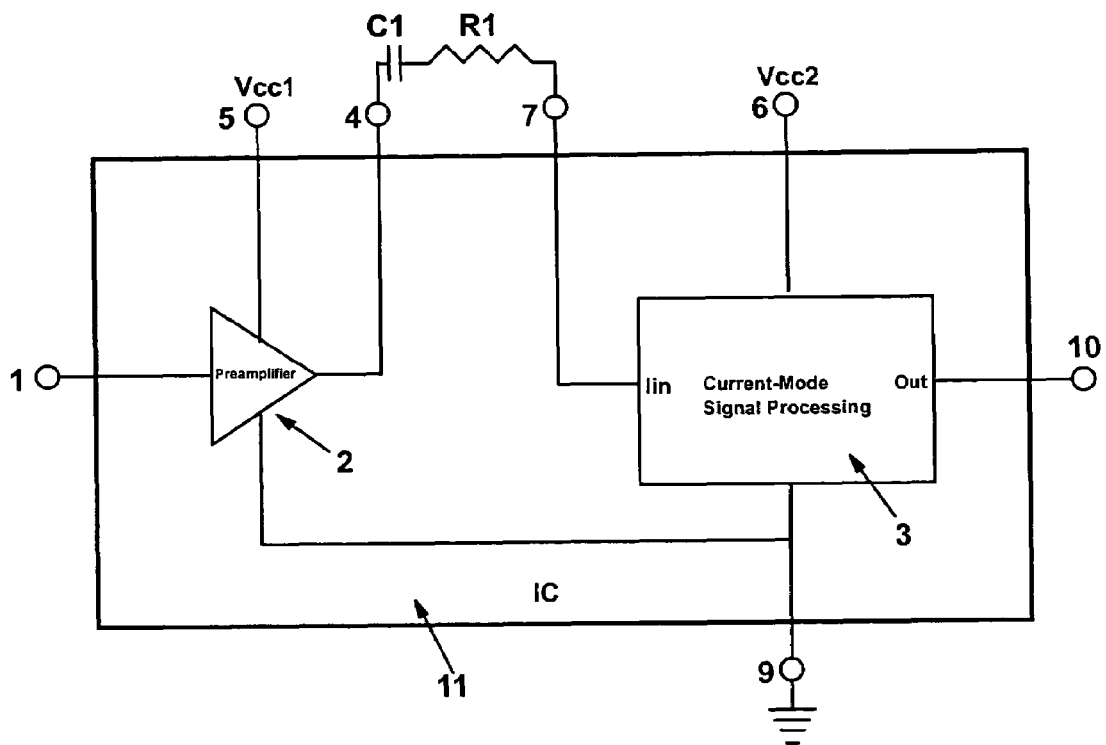
FIG. 2 is a block diagram of a preferred embodiment of an analog integrated circuit with a one positive power supply terminal for a current-mode signal-processing section, a separate second positive power supply terminal for an input-voltage preamplifier, and a common ground terminal, which serves as the negative power-supply terminal for both sections.

FIG. 2 shows a block diagram of an integrated circuit, 11, with two separate positive power supply terminals for providing different power supply voltages to the input-voltage preamplifier circuitry and the current-mode signal-processing circuitry. In this embodiment, preamplifier 2 receives positive power-supply voltage Vcc1 via terminal 5. Its negative power supply terminal, along with that of current-mode signal-processing block 3, is connected to a reference potential, or ground (as shown in the Figure), via terminal 9. Preamplifier 2 accepts and input voltage from terminal 1. Its output voltage, at terminal 4, will be capable of positive excursions between a value close to the positive supply voltage Vcc1, and a value close to ground. A second supply voltage Vcc2 is applied through the terminal 6 to the current-mode signal processing block 3. Power supply voltage Vcc1 is chosen to be greater than power supply voltage Vcc2 in order to allow a large voltage excursion at the output of preamplifier 2. The output voltage from preamplifier 2 is coupled to the input of current-mode signal processing block 3 via current-to-voltage conversion resistance R1 and ac coupling capacitor C1. The negative power supply terminal of signal processing block 3 is connected to the reference potential, or ground, via terminal 9. Current-to-voltage conversion resistor R1 and ac-coupling capacitor C1 function as described above for FIG. 1. Again, the output from current-mode signal processing block 3 is assumed to require small voltage excursions. A current-to-voltage converter operating from Vcc1 and ground could be added to produce an output voltage from the current-mode signal-processing block's output.

The embodiment in FIG. 2 is also well suited to applications that utilize other integrated circuits that operate from a single positive power supply, such as most digital logic circuits. In this case, the positive power supply voltage, Vcc2, would be shared by all of the ICs. The positive power-supply voltage for the preamplifier, Vcc1, can be generated from the positive power supply voltage Vcc1 via a charge pump. Since this charge pump must supply only the supply current for preamplifier 2, the required capacitors can be relatively small. With an appropriate semiconductor process, such a charge pump may be integrated into the integrated circuit 11, resulting in very low power-supply complexity for the application:

The choice between an embodiment similar to FIG. 1 and one similar to FIG. 2 would be made based, in part, on the design of the wide-voltage-swing circuitry that operates from the additional supply voltage. If the second supply voltage is generated by a charge pump or a capacitive voltage inverter, it is likely to be noisier than the primary power supply Vcc or Vcc1. As is well known in the art, many amplifier circuits exhibit better power-supply rejection from one power supply terminal than the other. Thus, it is advisable to design the integrated circuit such that the additional power supply voltage is connected to the terminal of the wide-voltage-swing circuitry that exhibits the best power supply rejection ratio.

It should be understood that an embodiment which incorporates power supply terminals for both the positive and negative power supply connections of the circuitry requiring large signal voltage swings separate from the power supply connections to the rest of the integrated circuit may be implemented in accordance with teachings of this disclosure. Such an implementation would increase the maximum dynamic range available for voltage signals, at the expense of added power-supply complexity and an additional terminal on the integrated circuit 11.

Wireless microphone systems are one such application where such an integrated circuit, such as described in connection with FIG. 1 or FIG. 2 may used to an advantage. In the majority of such systems, an analog voltage, representative of the sound (acoustic signal) picked up by a microphone capsule, is amplified, subjected to various types of signal conditioning, and then transmitted via a radio-frequency (RF) carrier to a remotely located receiver. It is important that the circuitry in the transmitter be compact and lightweight, as it is typically located in the case containing the microphone capsule, which is often handheld or worn by a performer. As batteries are a major component of the size and weight of this package, low-power, and, preferably, low-voltage circuitry is a requirement. Wide dynamic range is also a requirement, since the dynamic range of human hearing is on the order of 120 dB.

The signal-conditioning circuitry between the microphone capsule and an RF modulator in high-quality wireless microphone systems typically comprises a preamplifier, pre-emphasis and band-limiting filters, and a compressor circuit that functions as part of a syllabic companding system. The preamplifier serves to amplify the output voltage from the capsule (the audio signal), and to terminate it with an appropriate load impedance. This preamplifier should preferably have low input-referred noise so as to degrade the signal-to-noise ratio of the capsule output as little as possible. The preamplifier should also provide enough gain so that the noise contributions of subsequent circuitry in the signal path will be negligible. As is well known in the art, the pre-emphasis filters serve to further amplify high-frequency components of the audio signal so that they will be substantially higher in level than the noise added by the RF channel. A complementary de-emphasis filter in the receiver serves to restore flat overall frequency response in the audio bandwidth, and simultaneously attenuate the noise. The syllabic compander is another well-known approach to preserve dynamic range when noise is added to the signal of interest, in this case by the RF channel. Typically, such systems include a compressor circuit ahead of the noisy channel, and a complementary expander at the output of the noisy channel. A typical compressor circuit includes, at a minimum, a variable-gain element and a level detector. The gain of the variable-gain element in the compressor circuit is varied in response to the output of the level detector such that gain is decreased as the level of the signal of interest increases, and the gain is increased as the level of the signal of interest decreases. This serves to keep the signal of interest substantially higher in amplitude than the additive noise of the channel, and to minimize any occasions when the signal of interest may exceed the maximum possible amplitude that the channel can accommodate without excessive distortion. The expander circuit functions in a complementary fashion to restore the original dynamics to the signal of interest.

Figure 3:
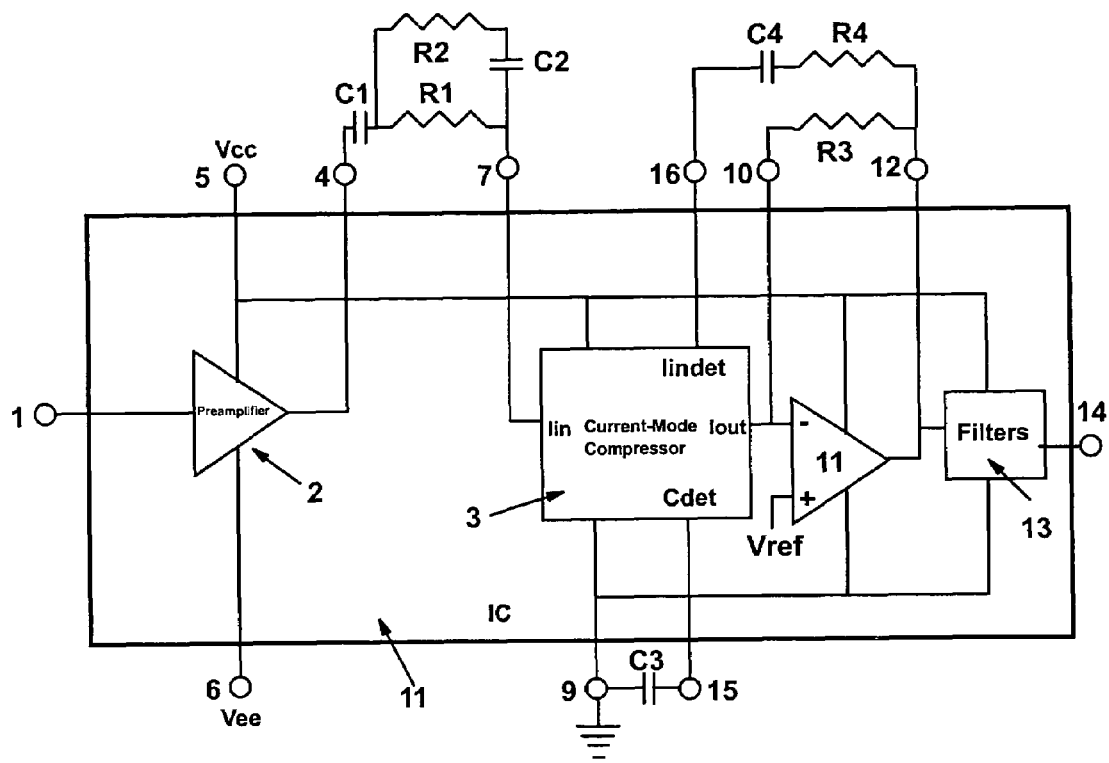
FIG. 3 is a block diagram of a preferred embodiment of an analog integrated circuit with three power supply terminals similar to that shown in FIG. 1, and further including a syllabic compressor.

FIG. 3 shows a block diagram of an embodiment of an integrated circuit intended for use as a signal processor for wireless microphones and including the architecture of the type previously described. In this embodiment, preamplifier 2 receives a positive power-supply voltage Vcc via terminal 5 and a negative power supply voltage Vee via terminal 6. Preamplifier 2 accepts an input voltage from terminal 1. Its output voltage, at terminal 4, will be capable of positive excursions up to a value close to the positive supply voltage Vcc and down to a value close to the negative supply voltage Vee. If Vcc and Vee are equal in magnitude, the available dynamic range of the output of preamplifier is increased by about 6 dB over the dynamic range available when it is operated from Vcc alone.

Current-mode compressor block 3 receives a positive power-supply voltage Vcc via terminal 5. Compressor block 3 has a negative power supply terminal connected to a reference potential, or ground, via terminal 9. Current-mode compressor block 3 comprises at a minimum a variable-gain element and a level detector. The gain of the variable-gain element in the compressor circuit is varied in response to the output of the level detector such that gain is decreased as the level of the signal of interest increases, and the gain is increased as the level of the signal of interest decreases. The output voltage from preamplifier 2 is coupled to the input of current-mode compressor block 3 via current-to-voltage conversion resistor R1 and ac coupling capacitor C1. AC coupling capacitor C1 blocks dc currents that would result from the differing dc bias potentials at terminals 4 and 7. The variable-gain element in compressor 3 receives an input current via terminal 7. Input terminal 7 is preferably a low-impedance virtual ground with a dc bias voltage between Vcc and ground. The output voltage from preamplifier 2 is coupled to the input of current-mode compressor block 3 via current-to-voltage conversion resistor R1 and ac coupling capacitor C1. Ac coupling capacitor C1 blocks dc currents that would result from the differing dc bias potentials at terminals 4 and 7. Resistor R2 and capacitor C2 forms a type of preemphasis network that increases the level of input currents in the variable gain block of compressor 3 at high frequencies.

The output current of the variable gain element in current-mode compressor block 3 is coupled to the inverting input of current-to-voltage conversion opamp 11, which is externally accessible through terminal 10. The output of the opamp 11 is externally accessible through the terminal 12. The non-inverting input of opamp 11 is internally connected to a reference voltage, Vref. The latter is preferably between positive supply voltage Vcc and ground. The external current-to-voltage conversion resistor R3 is connected between the terminal 10 and the terminal 12, thus forming a feedback resistor for the opamp 11, and determines the scaling of the output voltage produced in response to and as a function of the output current from compressor block 3. As is well known in the art, this configuration of feedback through the resistor R3 around opamp 11 creates a low-impedance virtual ground at the inverting input of opamp 11. Note that since the output voltage produced by opamp 11 is compressed due to the action of compressor block 3, the output voltage swing may be substantially less than that at the output of preamplifier 2 without loss of dynamic range. Thus, in this embodiment, opamp 11 can operate between supply voltage Vcc and ground.

The output of opamp 11 is coupled to the detector input of current-mode compressor block 3 at the terminal 16 via voltage-to-current conversion resistor R4 and ac coupling capacitor C4. Detector input terminal 16 is preferably a low-impedance virtual ground with a dc bias potential between Vcc and ground. Resistor R4 and capacitor C4 function similarly to resistor R1 and capacitor C1. As is well known in the art, the level detectors utilized in syllabic companders respond to a time-weighted average of some measure of the magnitude of the signal of interest. Capacitor C3, connected between compressor block 3 and ground via terminal 15, along with internal circuitry, implements the large averaging time constant for the detector as is well known. For syllabic companding of audio-band signals, the time constant is preferably on the order of several 10's of milliseconds, which can require capacitances that are impracticably large for integration. Alternatively, for other applications it may be possible to include these capacitances and resistances as a part of the integration.

In the embodiment of FIG. 3, the output of opamp 11 is also preferably coupled to filter block 13. Filter block 13 serves to bandlimit the output signal as necessary prior to RF modulation. As mentioned above, since the output signal from opamp 11 is compressed, the filter circuitry in block 13 may function on signal voltages, as opposed to currents, while still operating from positive supply voltage Vcc and ground without compromising dynamic range. Filter block 13 could also be implemented as a current-mode circuit. In this case, it would preferably be placed between compressor block 3 and opamp 11.

Figure 4:
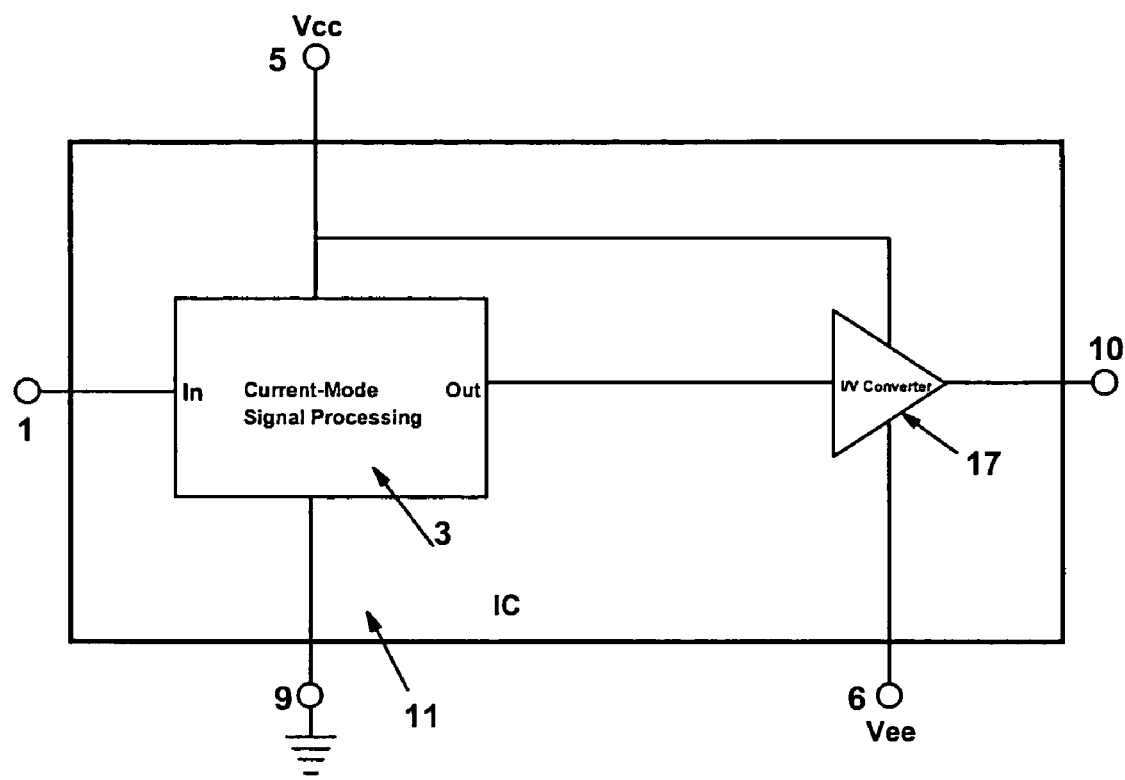
FIG. 4 is a block diagram of another embodiment of an analog integrated circuit.

FIG. 4 shows a block diagram an integrated circuit, 11, with a common positive power-supply terminal for a current-mode signal-processing section and an output current-to-voltage converter, and separate negative power-supply terminals for the current-mode signal-processing section and the output current-to-voltage converter. In this embodiment, current-mode signal-processing block 3 receives a positive power-supply voltage Vcc via terminal 5. Its negative power supply terminal is connected to the reference potential, or Ground, via terminal 9. Current-mode signal-processing block 3 accepts an input current from terminal 1. As is typical of such current-mode circuits, signal-processing block 3 is designed to have a low-impedance input (virtual ground) accepting input currents. In this embodiment, input terminal 1 of the current-mode signal-processing block 3 preferably has a dc bias potential between Vcc and Ground. 2 Current-to-voltage converter 17 accepts output current from signal-processing block 3 and produces an output voltage proportional to this current at terminal 10. As is typical of such circuits, current-to-voltage converter 17 is designed to have a low-impedance input (virtual ground) accepting input currents. Current-to-voltage converter 17 also receives a positive power-supply voltage Vcc via terminal 5 and a negative power supply voltage Vee via terminal 6. Its output voltage, at terminal 10, will be capable of positive excursions up to close to the positive supply voltage Vcc and negative excursions up to close to the negative supply voltage Vee. If Vcc and Vee are equal in magnitude, the available dynamic range at preamplifier 2's output is increased by about 6 dB over the dynamic range available when the current-to-voltage converter 17 is operated using only the power supply voltage Vcc. Current-to-voltage converter 17 preferably is designed to have a dc bias potential at its output half way between Vcc and Vee in order to maximize the possible voltage swing at its output.

Figure 5:
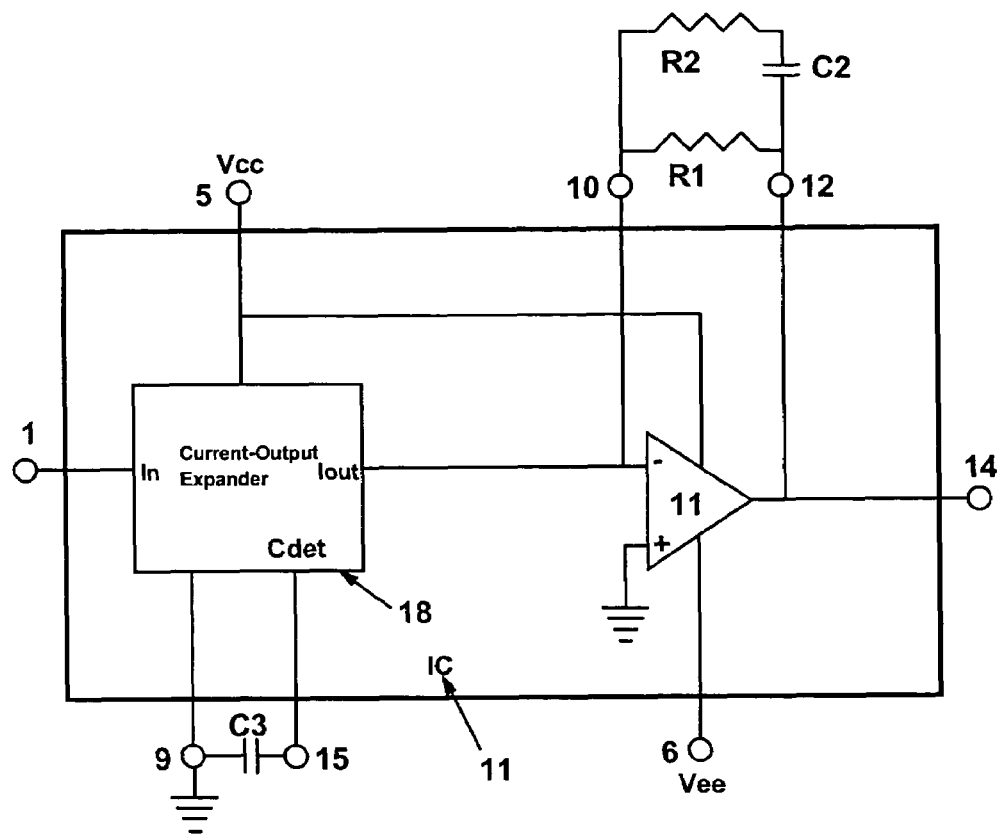
FIG. 5 is a block diagram of a preferred embodiment of an analog integrated circuit, and further including a syllabic expander.

FIG. 5 shows a block diagram of an embodiment of an integrated circuit intended for use as a expander for such devices as wireless in-ear monitors. Such devices typically employ syllabic expanders around an RF channel similar to that described above for wireless microphones. In this case, however, the receiver portion, including the syllabic expander, may be a portable, battery-powered portion of the system worn by a performer. In this embodiment, current-to-voltage converter opamp 11 receives a positive power-supply voltage Vcc via terminal 5 and a negative power supply voltage Vee via terminal 6. Current-to-voltage converter opamp 11 accepts an input current from current-output expander 18. Its output voltage, at terminal 14, will be capable of positive excursions up to a value close to the positive supply voltage Vcc and down to a value close to the negative supply voltage Vee. If Vcc and Vee are equal in magnitude, the available dynamic range of the output of preamplifier is increased by about 6 dB over the dynamic range available when it is operated from Vcc alone. Resistors R1 and R2, along with capacitor C2 provide the current-to-voltage conversion impedance, with R2 and C2 implementing a high-frequency deemphasis that is preferably complementary to a preemphasis network employed in the transmitter portion in such a system.

Current-output expander 18 receives a positive power-supply voltage Vcc via terminal 5. Current-output expander 18 preferably has a negative power supply terminal connected to a reference potential, or ground, via terminal 9. Current-output expander 18 comprises at a minimum a variable-gain element and a level detector. The gain of the variable-gain element in the expander circuit is varied in response to the output of the level detector such that gain is increased as the level of the signal of interest increases, and the gain is decreased as the level of the signal of interest decreases. Current-output expander 18 receives an input signal at terminal 1. This input signal could be in either current or voltage form, since the input signal will be expanded, and thus will require substantially less total excursion than the expanded output voltage at terminal 14.

As is well known in the art, the level detectors utilized in syllabic expanders respond to a time-weighted average of some measure of the magnitude of the signal of interest. Capacitor C3, connected between current-output expander 18 and ground via terminal 15, along with internal circuitry, implements the large averaging time constant for the detector as is well known. For syllabic expanding of audio-band signals, the time constant is preferably on the order of several 10's of milliseconds, which can require capacitances that are impracticably large for integration. Alternatively, for other applications it may be possible to include these capacitances and resistances as a part of the integration.

The embodiments and practices described in this specification have been presented by way of illustration rather than limitation, and various modifications, combinations and substitutions may be effected by those skilled in the are without departure either in spirit or scope from this disclosure in its broader aspects and as set forth in the appended claims.

We claim:

1. An integrated circuit disposed on a substrate and containing at least one analog circuitry section for producing a final analog output information signal in response to a first analog input information signal, the integrated circuit comprising:
    a first analog circuitry subsection disposed on the substrate, wherein the first analog circuitry subsection is configured to produce an intermediate analog output voltage signal in response to said first analog input information signal;
    a voltage-to-current conversion circuitry subsection, the voltage-to-current conversion circuitry subsection including a resistor and capacitor connected in series;
    a second analog circuitry subsection disposed on the substrate, wherein the second analog circuitry subsection is coupled to the voltage-to-current conversion circuitry subsection and configured to accept an intermediate analog input current signal proportional to said intermediate output voltage signal and produce said final analog output information signal in response to said intermediate analog input current signal, wherein the voltage-to-current conversion circuitry subsection is configured and arranged in series between and connects the first analog circuitry and the second analog circuitry subsection;
    a first power-supply-voltage terminal coupled to said first analog circuitry subsection;
    a second power-supply-voltage terminal coupled to said second analog circuitry subsection; and
    a third power-supply-voltage terminal coupled to said first analog circuitry subsection and said second analog circuitry subsection;
    wherein the available dynamic range of said intermediate analog output voltage signal is designed to exceed the difference in voltage applied between said second and third power-supply terminals.

2. An integrated circuit according to claim 1, wherein said second analog subsection is configured so as to produce an analog output current in response to said intermediate analog input current.

3. An integrated circuit according to claim 1, wherein said second analog subsection is configured so as to produce the final analog output information signal in response to said intermediate analog input current, and wherein said final analog output information signal comprises a voltage signal that is substantially less in total excursion than said intermediate output voltage.

4. An integrated circuit according to claim 1, wherein the first analog circuitry subsection comprises a first independent amplifier and the second analog circuitry subsection comprises a second independent amplifier.

5. An integrated circuit according to claim 4, wherein no feedback occurs between the first and second independent amplifiers.

6. An integrated circuit according to claim 4, wherein the circuit is configured and arranged to receive respective different power supplies by each of the first and second independent amplifiers.

7. An integrated circuit according to claim 6, wherein the first and second independent amplifiers are configured and arranged to accommodate a power supply difference substantially greater than 1 Vbe.

* * * * *